(12) United States Patent
Doyle et al.

(10) Patent No.: US 7,436,243 B1
(45) Date of Patent: Oct. 14, 2008

(54) INTEGRATED CIRCUITS WITH ON-CHIP AC NOISE SUPPRESSION

(75) Inventors: James T. Doyle, Nederland, CO (US);
Dae Woon Kang, Boulder, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 322 days.

(21) Appl. No.: 11/065,431

(22) Filed: Feb. 24, 2005

(51) Int. Cl.
*G05F 3/16* (2006.01)
*G05F 1/10* (2006.01)

(52) U.S. Cl. .................... 327/539; 323/314; 327/538; 327/541

(58) Field of Classification Search .............. 327/362, 327/538–543; 323/314, 315
See application file for complete search history.

(56) References Cited

U.S. PATENT DOCUMENTS

| | | | | |
|---|---|---|---|---|
| 3,825,307 | A * | 7/1974 | Carr et al. ............. | 303/122.05 |
| 4,710,991 | A * | 12/1987 | Wilmore et al. ............. | 5/637 |
| 5,923,076 | A * | 7/1999 | Campardo et al. ........... | 257/533 |
| 6,255,807 | B1 * | 7/2001 | Doorenbos et al. .......... | 323/314 |
| 6,646,511 | B2 | 11/2003 | Canyon et al. | |
| 6,701,138 | B2 | 3/2004 | Epperson et al. | |
| 6,703,682 | B2 * | 3/2004 | Aswell ........................ | 257/536 |
| 6,757,526 | B1 | 6/2004 | Sharp et al. | |
| 6,879,215 | B1 * | 4/2005 | Roach .......................... | 330/292 |
| 6,998,919 | B2 * | 2/2006 | Gamero et al. .............. | 330/289 |
| 7,242,074 | B2 * | 7/2007 | Erickson et al. ............. | 257/532 |
| 2004/0257150 | A1 * | 12/2004 | Farooqui ..................... | 327/539 |

FOREIGN PATENT DOCUMENTS

EP 0930619 * 7/1999

OTHER PUBLICATIONS

Dae Woon Kang et al., "A Low Power Methodology for Portable Electronics", Department of Electrical and Computer Engineering, Northeastern University.

* cited by examiner

*Primary Examiner*—Dinh T. Le

(57) ABSTRACT

On-chip AC noise suppression is provided for a target circuit within an integrated circuit chip. A power supply line filter is provided in the power supply line that feeds the target circuit. The filter includes a polysilicon resistor formed over a charged substrate well, with a dielectric material interposed between the well and the resistor. This decreases capacitive coupling between the substrate and the resistor, thereby suppressing AC noise that is injected via the substrate. For an on-chip bandgap reference circuit, AC noise suppression can be achieved by providing matched AC impedances in the PTAT and inverse PTAT branches of the circuit. This technique exploits the common-mode rejection capability of the error amplifier within the bandgap reference circuit. Also, the inputs of the error amplifier can be capacitively coupled together to exploit the amplifier's common-mode rejection capability for the suppression of AC noise that is injected at the amplifier inputs.

16 Claims, 3 Drawing Sheets

INTEGRATED CIRCUITS WITH ON-CHIP AC NOISE SUPPRESSION

TECHNICAL FIELD OF THE INVENTION

The invention relates generally to integrated circuits and, more particularly, to techniques for improving the AC noise immunity of integrated circuits.

BACKGROUND OF THE INVENTION

In conventional portable/mobile data processing and communication devices, data processing and control circuitry are being packed ever more closely together with high frequency communication circuits, such as amplifiers which amplify a communication signal for transmission across a communication medium. For example, in a typical cellular telephone, the RF power amplifier is very close to the CMOS controller integrated circuit (IC) which controls the operation of the power amplifier. In an open-loop power controller arrangement, the CMOS controller delivers current to the power amplifier, and controls the delivered current appropriately to modulate the power amplifier's output as desired. The AC voltage output of the power amplifier can be 30-40 volts peak-to-peak, into 50 ohms. This means that approximately 4 amperes of AC current (for example at 2 GHz) can be inductively and resistively modulated directly onto the CMOS controller IC. This can cause AC voltages of more than 4 volts peak-to-peak to be present everywhere on the IC.

Although the output PFET of the CMOS controller IC may be able to function (with a somewhat diminished signal integrity) under these conditions, the bandgap reference circuits of the controller IC will not function under these conditions. The bipolar transistors that are used to implement diodes in conventional bandgap reference circuits exhibit minority carrier lifetimes that are typically greater than 1 nanosecond. This means that, at a frequency of 1 GHz, there is not enough time for these carriers to recombine. The impact of this is that the classical junction potential collapses and the junctions become entirely resistive in nature, so the diode junction is no longer viable as a reference.

In order to protect bandgap reference circuits from AC noise and interference, some conventional approaches use off-chip bandgap reference circuits located externally of the power amplifier controller IC. By using an off-chip bandgap reference circuit, various conventional AC noise suppression techniques such as shielding, clamping diodes and large bypass capacitors can be used to reduce the effect of AC noise and interference on the bandgap reference circuit. This approach consumes additional space and presents physical design difficulties that are not present when the bandgap reference circuit is provided on-chip, within the power controller IC.

It is therefore desirable to provide for on-chip protection of an on-chip bandgap reference circuit against AC noise/interference.

SUMMARY OF THE INVENTION

To address the above-discussed deficiencies of the prior art, it is a primary object of the present invention to provide on-chip AC noise suppression for a target circuit within an IC chip. Some embodiments provide a power supply line filter in the power supply line that feeds the target circuit. The filter includes a polysilicon resistor formed over a charged substrate well, with a dielectric material interposed between the well and the resistor. This decreases capacitive coupling between the substrate and the resistor, and thereby suppresses AC noise that is injected via the substrate.

Some embodiments achieve AC noise suppression in a bandgap reference circuit by providing matched AC impedances in the PTAT and inverse PTAT branches of the circuit in order to exploit the common-mode rejection capability of the bandgap reference circuit's error amplifier.

Some embodiments capacitively couple the inputs of the error amplifier together to exploit the amplifier's common-mode rejection capability for the suppression of AC noise that is injected at the amplifier inputs.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 8, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged system.

Figure 1:
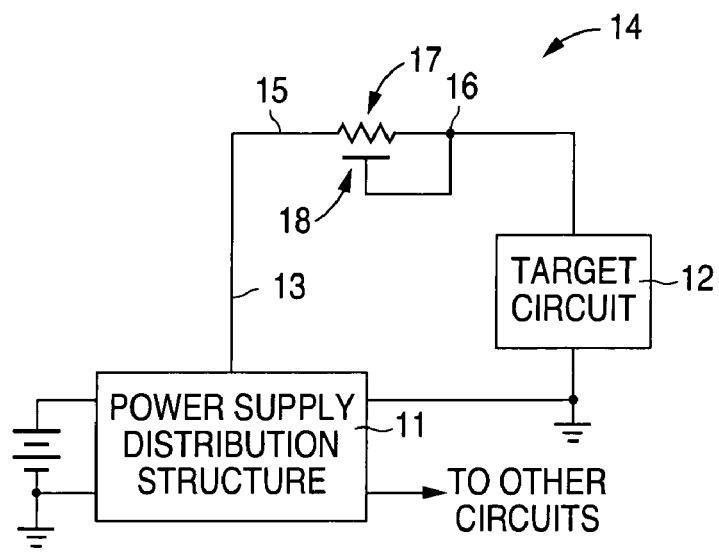
FIG. 1 diagrammatically illustrates exemplary embodiments of an on-chip power supply line filter according to the invention.

FIG. 1 diagrammatically illustrates a power supply line filter according to exemplary embodiments of the invention. As shown in FIG. 1, a power supply distribution structure 11 within an integrated circuit distributes battery power to various circuit modules within the integrated circuit. The power supply line 13 that supplies power to a target circuit 12 (e.g. a bandgap reference circuit) is filtered at 14 to suppress AC noise/interference. The AC noise suppression filter 14 includes a polysilicon resistor 17 provided over a charged well 18 formed in the substrate of the IC. The well 18 is connected to the end 16 of resistor 17 opposite the power supply distribution structure 11. The other end 15 of resistor 17 is connected to the power supply line 13.

Figure 2:
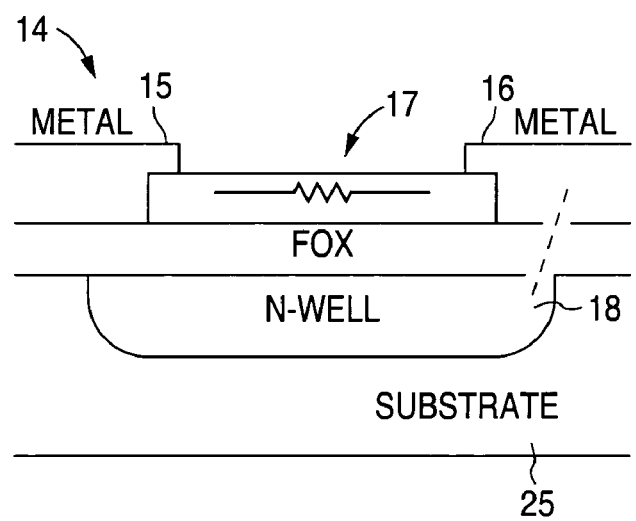
FIG. 2 illustrates exemplary embodiments of the filter of FIG. 1 in more detail.

FIG. 2 illustrates exemplary embodiments of the filter 14 of FIG. 1 in more detail. In the example of FIG. 2, the charged well 18 is an N-well provided in the substrate 25 of the integrated circuit. A dielectric material, for example the field oxide (FOX) 23 in FIG. 2, is interposed between the well 18 and the polysilicon resistor 17. The well 18 is connected to the end 16 of the polysilicon resistor 17, as indicated diagrammatically by broken line in FIG. 2. The use of a charged well (e.g., the N-well in FIG. 2) beneath the polysilicon resistor 17 provides an additional diffusion capacitance with respect to the substrate 25. This additional capacitance is in series with the coupling capacitance normally associated with a polysilicon resistor situated on a dielectric material such as the field oxide 23.

Figure 3:
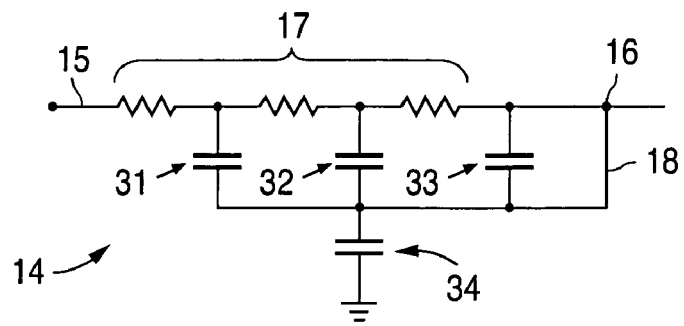
FIG. 3 diagrammatically illustrates the equivalent circuit of the filter of FIGS. 1 and 2.

The capacitance arrangement resulting from the structure of FIGS. 1 and 2 is illustrated in the equivalent circuit of FIG. 3. Coupling capacitances such as shown at 31, 32 and 33 are normally associated with a polysilicon resistor provided on a dielectric material such as the field oxide 23. These coupling capacitances are connected in series with a capacitance 34, which is the diffusion capacitance of the charged well 18 with respect to the substrate 25. Note also that the charged well 18 is connected to the end 16 of polysilicon resistor 17 opposite the power supply distribution structure 11 (see also FIG. 1). The additional series capacitance 34 results in a smaller equivalent capacitance between the polysilicon resistor 17 and the substrate 25, thereby decreasing the capacitive coupling between the polysilicon resistor 17 and the substrate 25. This can be important because the substrate 25 can itself be an injection source of the pervasive type of AC interference described above. The connection of the charged well 18 to the end 16 of the resistor 17 opposite the power supply distribution structure 11 permits the resistor 17 to attenuate some of the AC interference injected by the power supply line 13 before it reaches the capacitances of the equivalent circuit of FIG. 3.

Figure 4:
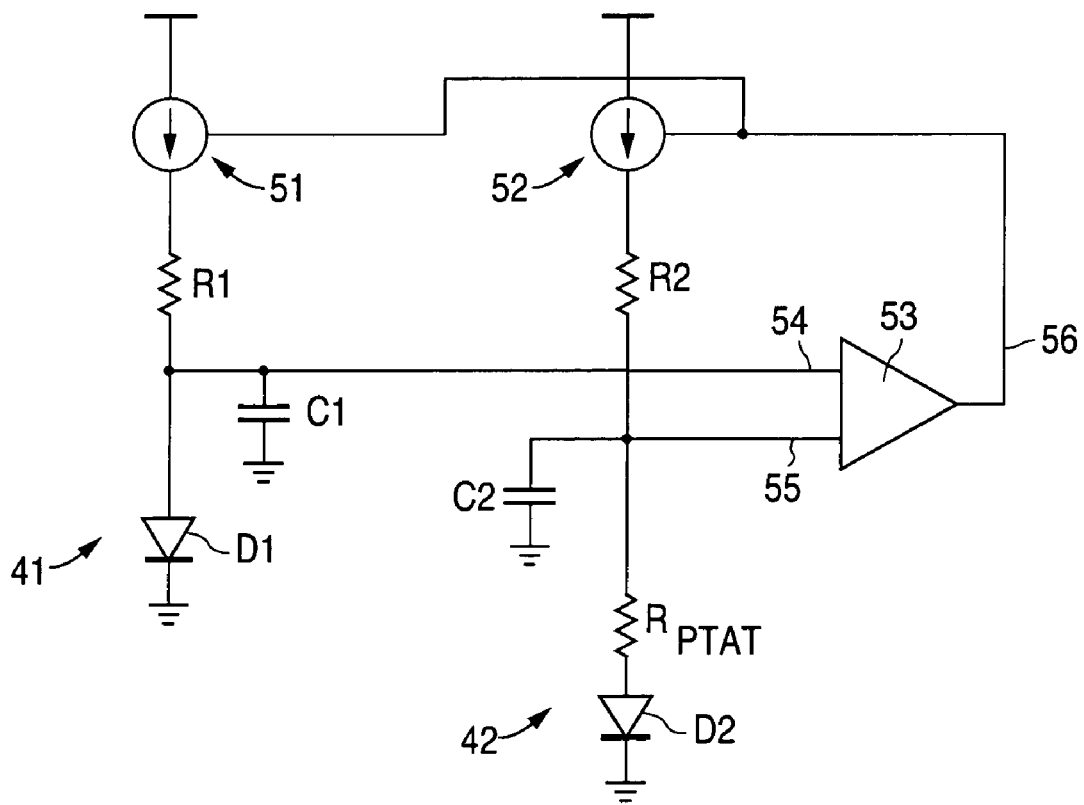
FIG. 4 diagrammatically illustrates a bandgap reference circuit with impedance matching for AC noise suppression according to exemplary embodiments of the invention.

FIG. 4 diagrammatically illustrates exemplary embodiments of a bandgap reference circuit provided within an IC according to the invention. The bandgap reference circuit of FIG. 4 includes a PTAT (Proportional To Absolute Temperature) branch 42 and an inverse PTAT branch 41. A node from the PTAT branch 42 is connected to an input 55 of an error amplifier 53, and a node from the inverse PTAT branch 41 is connected to an input 54 of the amplifier 53. The output 56 of the amplifier 53 controls current sources 51 and 52 provided in the respective branches 41 and 42. The input 54 of amplifier 53 is connected to the anode of a diode D1 in the inverse PTAT branch 41. The input 55 of the amplifier 53 is connected to a first end of a resistor $R_{PTAT}$ whose second end is connected to the anode of a diode structure D2. The diode structure D2 in the PTAT branch 42 represents a plurality of diodes similar to D1, connected in parallel with one another. The above-described use of the diode structures at D1 and D2, the resistor $R_{PTAT}$, the error amplifier 53, and the current sources 51 and 52 to generate a bandgap reference voltage is well known in the art.

The embodiments of FIG. 4 provide the branches 41 and 42 with impedance matching circuitry R1, R2, C1 and C2. The values of the series resistances R1 and R2 in the respective branches 41 and 42, and the values of the capacitance C1 (between ground and the anode of D1) and the capacitance C2 (between ground and the first end of $R_{PTAT}$) are determined so as to produce approximately the same AC impedance in both of the branches 41 and 42. If both branches 41 and 42 present the same AC impedance, then the AC interference levels at the inputs 54 and 55 of the amplifier 53 can be expected to be approximately equal, so the effect of the AC interference can be effectively canceled by the normal common-mode rejection operation of the amplifier 53. The impedance presented by $R_{PTAT}$ and the parallel diode structure at D2 in branch 42 differs from the impedance presented by the diode D1 in branch 41. Accordingly, in some embodiments, the resistance R2 will differ from the resistance R1, and the capacitance C2 will differ from the capacitance C1, in order to compensate appropriately for the respectively different impedances that are presented by the two branches 41 and 42 without the impedance matching circuitry R1, R2, C1 and C2.

Figure 8:
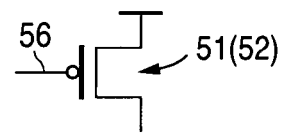
FIG. 8 illustrates exemplary embodiments of the current sources of FIG. 4 according to the invention.

In some embodiments, in order to provide enough power supply voltage headroom for insertion of the resistances R1 and R2, each of the current sources 51 and 52 is provided as a single MOS transistor, as shown in FIG. 8. The use of a single transistor in each branch 41 and 42 results in a voltage drop across each current source 51 and 52 that is smaller than a voltage drop associated with a cascode current source. This provides extra power supply voltage headroom for insertion of the resistances R1 and R2. If each MOS transistor is provided with an extended channel length, this will increase its drain-source conductance, and will also provide sufficiently high output impedance.

Figure 5:
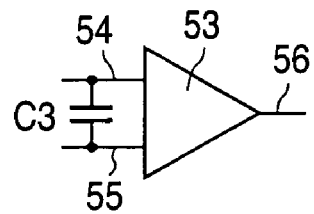
FIG. 5 illustrates alternative embodiments of the bandgap reference circuit of FIG. 4 according to the invention.

FIG. 5 illustrates alternative embodiments of the bandgap reference circuit of FIG. 4. In the example of FIG. 5, a capacitance C3 (0.1 pF in some embodiments) is connected across the inputs 54 and 55 of the amplifier 53. The present invention recognizes that, even with matched AC impedances in the branches 41 and 42 of FIG. 4, the inputs 54 and 55 of the amplifier 53 can themselves act as antennas which collect AC interference directly, "downstream" of the impedance matched branches 41 and 42. Accordingly, the capacitance C3 will tend further to equalize the AC levels at the inputs 54 and 55, thereby further enabling the amplifier 53 to eliminate AC interference by its common-mode rejection operation.

Figure 6:
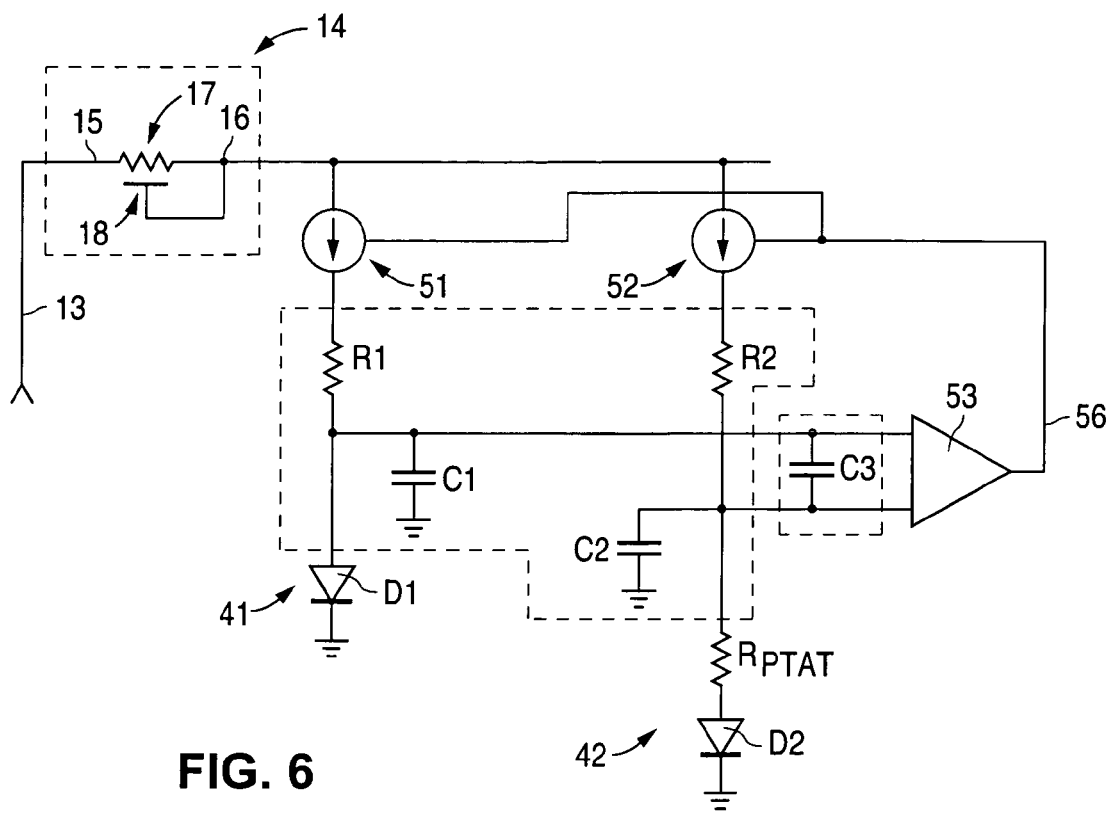
FIG. 6 diagrammatically illustrates how the AC noise suppression techniques of FIGS. 1-5 can be combined according to exemplary embodiments of the invention.

FIG. 6 diagrammatically illustrates further exemplary embodiments of an integrated circuit according to the invention. FIG. 6 is generally similar to FIG. 1, with the target circuit 12 of FIG. 1 realized as a bandgap reference circuit according to the exemplary embodiments of FIGS. 4 and 5. As illustrated in FIG. 6, the AC noise suppression measures of FIGS. 4 and 5 can be combined with the power supply line filter 14 of FIG. 1 to produce a bandgap reference circuit that has improved immunity to AC interference. In FIG. 6, the filter 14 of FIGS. 1-3, the impedance matching circuitry R1, R2, C1 and C2 of FIG. 4, and the capacitance C3 of FIG. 5 are each designated by respectively corresponding broken line enclosures. These broken line enclosures indicate that, in various embodiments, various ones of these features can be omitted and various others of these features can be combined as desired.

Figure 7:
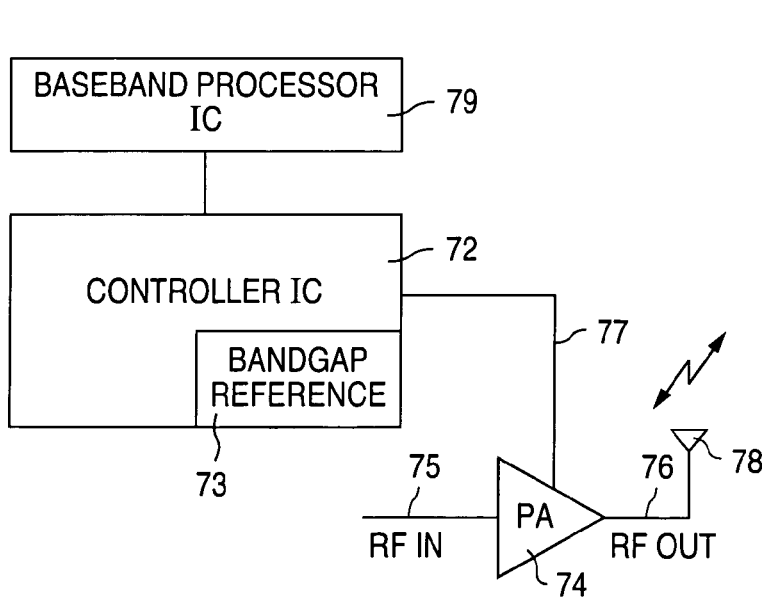
FIG. 7 diagrammatically illustrates exemplary embodiments of a mobile data processing/communication device according to exemplary embodiments of the invention.

FIG. 7 diagrammatically illustrates exemplary embodiments of a mobile data processing/communication device (for example a mobile telephone or mobile computer) according to exemplary embodiments of the invention. As shown in FIG. 7, a controller IC 72, for example a CMOS controller IC, uses an output 77 to control a power amplifier (PA) 74 which amplifies an RF input signal 75 to produce an RF output signal 76 for wireless transmission via an antenna apparatus 78. The controller IC 72 includes a bandgap reference circuit 73 according to the exemplary embodiments described above with respect to FIGS. 4-6. In addition to the bandgap reference circuit 73, the controller IC 72 can, in some embodiments, include the power supply line filtering embodiments of FIGS. 1-3 to filter the power supply input to target circuit modules other than the bandgap reference circuit 73.

Although the present invention has been described with exemplary embodiments, various changes and modifications may be suggested to one skilled in the art. It is intended that the present invention encompass such changes and modifications as fall within the scope of the appended claims.

What is claimed is:

1. An integrated circuit, comprising:
   a power supply node that receives current from a power supply;
   a target circuit; and
   a filter coupled between said power supply node and said target circuit, said filter including a charged well provided in a substrate of the integrated circuit, a polysilicon resistor, and a dielectric material interposed between said charged well and said polysilicon resistor, said polysilicon resistor having a first end coupled to said power supply node and having a second end coupled to said target circuit,
   wherein said target circuit includes a bandgap reference circuit,
   wherein said bandgap reference circuit includes a PTAT branch, an inverse PTAT branch, and impedance matching circuitry cooperable with said branches for providing said branches with respective AC impedances that are approximately equal to one another.

2. The integrated circuit of claim 1, wherein said impedance matching circuitry includes first and second resistances respectively connected in series in said branches, and first and second capacitances respectively connected to said branches, each of said first and second capacitances also connected to a common reference potential.

3. The integrated circuit of claim 2, wherein each of said branches includes a single MOS transistor connected in series between said second end of said polysilicon resistor and the associated one of said first and second resistances.

4. The integrated circuit of claim 1, wherein said bandgap reference circuit includes an amplifier having first and second inputs respectively connected to said PTAT and inverse PTAT branches, and a capacitance connected between said first and second inputs of said amplifier.

5. The integrated circuit of claim 1, in combination with a power amplifier connected thereto, said power amplifier amplifying an RF communication signal under control of said target circuit.

6. An integrated circuit, comprising:
   a power supply node that receives current from a power supply;
   a target circuit that performs a desired operation, said target circuit including a bandgap reference circuit, said bandgap reference circuit including a PTAT branch, an inverse PTAT branch, impedance matching circuitry coupled to said branches and cooperable therewith for providing said branches with respective AC impedances that are approximately equal to one another, an amplifier having first and second inputs respectively connected to said branches, and a capacitance connected between said first and second inputs;
   a filter coupled between said power supply node and said bandgap reference circuit, said filter including a charged well provided in a substrate of the integrated circuit, a polysilicon resistor, and a dielectric material interposed between said charged well and said polysilicon resistor, said polysilicon resistor having a first end coupled to said power supply node and having a second end coupled to said bandgap reference circuit.

7. The integrated circuit of claim 6, wherein said charged well is an N-well.

8. The integrated circuit of claim 6, wherein said charged well is connected to said second end of said polysilicon resistor.

9. The integrated circuit of claim 6, wherein said impedance matching circuitry includes first and second resistances respectively connected in series in said branches, and first and second capacitances respectively connected to said branches, each of said first and second capacitances also connected to a common reference potential.

10. The integrated circuit of claim 9, wherein each of said branches includes a single MOS transistor connected in series between said second end of said polysilicon resistor and the associated one of said first and second resistances.

11. The integrated circuit of claim 6, in combination with a power amplifier connected thereto, said power amplifier amplifying an RF communication signal under control of said target circuit.

12. An integrated circuit, comprising:
    a target circuit that performs a desired operation; and
    a bandgap reference circuit coupled to said target circuit, said bandgap reference circuit including a PTAT branch, an inverse PTAT branch, and impedance matching circuitry coupled to said branches and cooperable therewith for providing said branches with respective AC impedances that are approximately equal to one another.

13. The integrated circuit of claim 12, wherein said impedance matching circuitry includes first and second resistances respectively connected in series in said branches, and first and second capacitances respectively connected to said branches, each of said first and second capacitances also connected to a common reference potential.

14. The integrated circuit of claim 13, wherein each of said branches includes a single MOS transistor connected in series between a power supply node and the associated one of said first and second resistances.

15. The integrated circuit of claim 12, wherein said bandgap reference circuit includes an amplifier having first and second inputs respectively connected to said branches, and a capacitance connected between said first and second inputs.

16. The integrated circuit of claim 12, in combination with a power amplifier connected thereto, said power amplifier amplifying an RF communication signal under control of said target circuit.

* * * * *